(12) United States Patent
Miyamoto

(10) Patent No.: US 8,084,997 B2
(45) Date of Patent: Dec. 27, 2011

(54) VOLTAGE SENSOR MODULE AND VOLTAGE MONITORING APPARATUS

(75) Inventor: Manabu Miyamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 855 days.

(21) Appl. No.: 12/117,375

(22) Filed: May 8, 2008

(65) Prior Publication Data
US 2008/0278172 A1 Nov. 13, 2008

(30) Foreign Application Priority Data

May 10, 2007 (JP) ................................. 2007-125942

(51) Int. Cl.
*H02J 7/00* (2006.01)
*H02J 7/16* (2006.01)

(52) U.S. Cl. ......... 320/134; 320/135; 320/137; 320/148

(58) Field of Classification Search ................. 324/433, 324/434, 435; 320/116, 118, 134, 135, 136, 320/161, 162, 137, 148
See application file for complete search history.

(56) References Cited

U.S. PATENT DOCUMENTS

| | | | |
|---|---|---|---|
| 4,622,508 A * | 11/1986 | Matteau et al. | 320/118 |
| 5,847,544 A * | 12/1998 | Eguchi | 320/136 |
| 6,020,718 A * | 2/2000 | Ozawa et al. | 320/116 |
| 6,081,095 A * | 6/2000 | Tamura et al. | 320/118 |
| 6,121,752 A | 9/2000 | Kitahara et al. | |
| 6,172,485 B1 * | 1/2001 | Fujita et al. | 320/136 |
| 6,225,779 B1 * | 5/2001 | Fujita et al. | 320/116 |
| 6,242,890 B1 * | 6/2001 | Sudo et al. | 320/128 |
| 6,373,225 B1 * | 4/2002 | Haraguchi et al. | 320/122 |
| 7,098,626 B2 * | 8/2006 | Seo et al. | 320/150 |
| 7,759,903 B2 * | 7/2010 | Kamata | 320/134 |
| 2007/0030056 A1 * | 2/2007 | Sobue et al. | 327/543 |
| 2008/0265947 A1 | 10/2008 | Sobue | |

FOREIGN PATENT DOCUMENTS

| | | |
|---|---|---|
| JP | 11-155214 A | 6/1999 |
| JP | 11-155241 A | 6/1999 |
| JP | 2007-43871 A | 2/2007 |

* cited by examiner

*Primary Examiner* — Edward Tso
*Assistant Examiner* — Alexis Boateng
(74) *Attorney, Agent, or Firm* — Sughrue Mion, PLLC

(57) ABSTRACT

Provided is a voltage sensor module monitoring a voltage of each of a plurality of battery cells, including: first and second terminals each receiving a voltage applied between both ends of the plurality of battery cells; third and fourth terminals each receiving a voltage applied between both ends of a battery cell to be monitored which is included in the plurality of battery cells; a first reference voltage generation circuit connected to each of the first and second terminals and generating a first reference voltage based on the voltage applied between the both ends of the plurality of battery cells; and a first comparator circuit comparing a first regulated voltage generated based on a voltage applied between the third and fourth terminals, with the first reference voltage. As a result, low voltage detection can be performed with accuracy even when an output of a battery cell decreases.

19 Claims, 10 Drawing Sheets

VOLTAGE SENSOR MODULE AND VOLTAGE MONITORING APPARATUS

BACKGROUND OF THE INVENTION

1. Field of the Invention

The present invention relates to a battery voltage monitoring apparatus that detects a battery voltage of a power supply device including a plurality of secondary batteries connected in series. In particular, the present invention relates to a battery voltage monitoring apparatus that detects an abnormal voltage related to voltage measurement.

2. Description of Related Art

Conventionally, an electric vehicle and a hybrid vehicle have been known as environmentally friendly vehicles. A motor is used as a drive source for driving such an electric vehicle and hybrid vehicle. The motor is connected with a rechargeable secondary battery. A DC voltage obtained from the secondary battery is converted into an AC voltage, whereby the motor is driven. Since the secondary battery requires a high voltage, the secondary battery is generally implemented as a battery pack having a plurality of battery cells connected in series.

In order to detect voltages of the battery cells of the battery pack, a plurality of voltage sensors are used. The voltage sensors are divided into an appropriate number of groups to be modularized. When a large number of battery cells to be connected in series are required for electric vehicles and the like, a plurality of voltage sensor modules are also prepared and connected in series. Japanese Unexamined Patent Application Publications Nos. 09-159701 and 2003-092840 each disclose an apparatus for monitoring a voltage of such a battery pack. A description is given below of the apparatus for monitoring the voltage of the battery pack, in which the module including the plurality of voltage sensors is formed of a single semiconductor device (IC) and a plurality of semiconductor devices are connected to each other.

FIG. 8 shows a voltage monitoring apparatus for monitoring an output voltage of a battery pack according to the related art. The battery pack includes a plurality of battery cells connected in series, and a plurality of battery terminals. Outputs of the battery cells are connected to corresponding battery terminals. FIG. 8 also shows an example where 80 battery cells each having an electromotive voltage of 3.6 V are connected in series.

The voltage monitoring apparatus includes voltage sensor modules (ICs), input terminals, and output terminals. The input terminals are connected to the battery terminals of the battery pack and to module input terminals of the voltage sensor modules so as to receive voltages output by the battery cells and supply the voltages to each of the voltage sensor modules. The output terminals are connected to module output terminals of the voltage sensor modules so as to output monitoring results of the voltage sensor modules to an outside of the voltage monitoring apparatus. In FIG. 8, the voltage monitoring apparatus includes 20 voltage sensor modules each capable of monitoring output voltages of four battery cells, thereby making it possible to monitor output voltages of all the 80 battery cells included in the battery pack.

FIG. 9 shows a voltage sensor module for monitoring output voltages of four battery cells according to the related art. The voltage sensor module includes two types of comparators (overvoltage detection comparator and undervoltage detection comparator) and reference voltage generation circuits. In the voltage sensor module, a reference voltage output from each of the reference voltage generation circuits is compared with a voltage generated based on an output voltage of each battery cell, whereby undervoltage detection and overvoltage detection are performed with respect to an output voltage of each battery cell. The undervoltage detection and the overvoltage detection for a single battery cell require each one of the reference voltage generation circuit, the undervoltage detection comparator, and the overvoltage detection comparator.

Each reference voltage generation circuit is connected between the module input terminals connected to both ends (positive electrode side and negative electrode side) of a single battery cell via the battery terminals of the battery pack and the input terminals of the voltage monitoring apparatus so as to generate a reference voltage based on a voltage applied between the module input terminals. Between the module input terminals, in parallel with the reference voltage generation circuit, three resistors are connected in series, and two types of resistance-divided voltages are obtained by resistance voltage division.

In this case, by focusing on a battery cell A of FIG. 9, a detailed description is given of a connection relation between the reference voltage generation circuit (Vref), the undervoltage detection comparator, and the overvoltage detection comparator, and operations thereof (undervoltage detection and overvoltage detection).

A positive electrode side of the battery cell A is electrically connected to a module input terminal N3 of the voltage sensor module via an external terminal N1 of the battery pack and an input terminal N2 of the voltage monitoring apparatus. On the other hand, a negative electrode side of the battery cell A is electrically connected to a module input terminal N6 of the voltage sensor module via an external terminal N4 of the battery pack and an input terminal N5 of the voltage monitoring apparatus. Moreover, between the module input terminals N3 and N6, three resistors connected in series are connected in parallel with the reference voltage generation circuit VrefA. Note that, as shown in FIG. 9, when it is assumed that nodes between the resistors connected in series correspond to points A and B, a voltage applied between the module input terminals N3 and N6 is divided by the resistors (resistance-divided voltage at point A is larger than resistance-divided voltage at point B).

An inverting input terminal of an undervoltage detection comparator A is connected to the point A, and a non-inverting input terminal of the undervoltage detection comparator A is connected to the VrefA. On the other hand, an inverting input terminal of an overvoltage detection comparator A is connected to the VrefA, and a non-inverting input terminal of the overvoltage detection comparator A is connected to the point B. In addition, outputs of the undervoltage detection comparator A and the overvoltage detection comparator A are connected to module output terminals N7 and N8 of the voltage sensor module, respectively.

A reference voltage and resistance output by the VrefA are set to such values that the undervoltage detection comparator A and the overvoltage detection comparator A each output an "L" level signal indicating a normal state, when an output voltage of the battery cell A falls within an allowable voltage range. Accordingly, when the output voltage of the battery cell A decreases to an undervoltage side from the allowable range (when output voltage decreases to an abnormal value), the resistance-divided voltage at the point A also decreases to an abnormal value. The undervoltage detection comparator A compares the resistance-divided voltage at the point A, which is an abnormally low voltage, with the reference voltage, and outputs an "H" level signal indicating that the output voltage abnormally decreases to the undervoltage side. On the contrary, when the output voltage of the battery cell A increases to an overvoltage side from the allowable range (when output voltage increases to an abnormal value), the resistance-divided voltage at the point B also increases to an abnormal value. The overvoltage detection comparator A compares the resistance-divided voltage at the point B, which is an abnormally high voltage, with the reference voltage, and outputs an "H" level signal indicating that the output voltage increases abnormally to the overvoltage side. In this manner, the voltage monitoring apparatus of the related art detects an abnormality when the output voltage of the battery cell becomes undervoltage or overvoltage.

Note that Japanese Unexamined Patent Application Publication Nos. 09-159701 and 2003-092840 disclose an overvoltage detecting apparatus for a battery pack and a battery pack controller, respectively.

However, when the output voltage of the battery cell decreases to or below a predetermined level, the reference voltage generation circuit for generating the reference voltage based on the battery cell that causes a voltage drop becomes incapable of generating an appropriate reference voltage. In a case where the appropriate reference voltage is not generated, normal operations of an undervoltage detection system using the undervoltage detection comparator cannot be expected.

FIG. 10 shows a potential at the point A, an output of the VrefA, and an output of the undervoltage detection comparator A, with respect to a variation in output voltage of the battery cell A. When the output voltage of the battery cell A is equal to larger than V1, the potential at the point A becomes larger than the output voltage of the VrefA. In this case, the undervoltage detection comparator A produces an "L" level output, and it is detected that the voltage within a normal range is output by the battery cell A (undervoltage is not detected).

When the output voltage of the battery cell A is equal to or lower than V1, the output voltage of the battery cell A becomes an abnormal voltage to the undervoltage side. When the output voltage of the battery cell A becomes V2, it is impossible to generate a threshold voltage (reference voltage) for detecting the undervoltage based on the reference voltage. As a result, the output voltage of the battery cell A decreases, and at the same time, the output voltage of the VrefA gradually decreases. During a time when the output voltage of the VrefA is higher than the potential at the point A (between V3 and V1), the undervoltage detection comparator produces an "H" level output. Accordingly, it is possible to normally detect that the output voltage of the battery cell A is undervoltage. However, when the output voltage of the battery cell A is equal to or lower than V3, the output voltage of the VrefA further decreases below the potential at the point A. In this case, even though the output voltage of the battery cell A is an abnormal voltage, the undervoltage comparator A produces the "L" level output, and it is detected that the battery cell A outputs the voltage within the normal range.

Thus, in the undervoltage detection system of the voltage monitoring apparatus for a battery pack according to the related art, there is a problem in that, when an output voltage of a battery cell serving as a detection target decreases to or below the predetermined level, it is impossible to detect an undervoltage abnormality of the battery cell.

SUMMARY

In one embodiment of the present invention, there is provided a voltage sensor module monitoring a voltage of each of a plurality of battery cells, including: a first terminal and a second terminal each to receive a voltage applied between both ends of the plurality of battery cells; a third terminal and a fourth terminal each to receive a voltage applied between both ends of a battery cell to be monitored which is included in the plurality of battery cells, a first reference voltage generation circuit connected to each of the first terminal and the second terminal and to generate a first reference voltage based on the voltage applied between the both ends of the plurality of battery cells and a first comparator circuit to compare a first regulated voltage generated based on a voltage applied between the third terminal and the fourth terminal, with the first reference voltage.

With such a configuration, even when an output of a single battery cell is equal to or lower than a predetermined level, it is possible to generate a stable reference voltage unless outputs of other battery cells decrease to or below the predetermined level.

Even when a voltage output by a battery cell is equal to or lower than the predetermined level, it is possible to detect an undervoltage abnormality of the battery cell.

BRIEF DESCRIPTION OF THE DRAWINGS

The above and other objects and advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
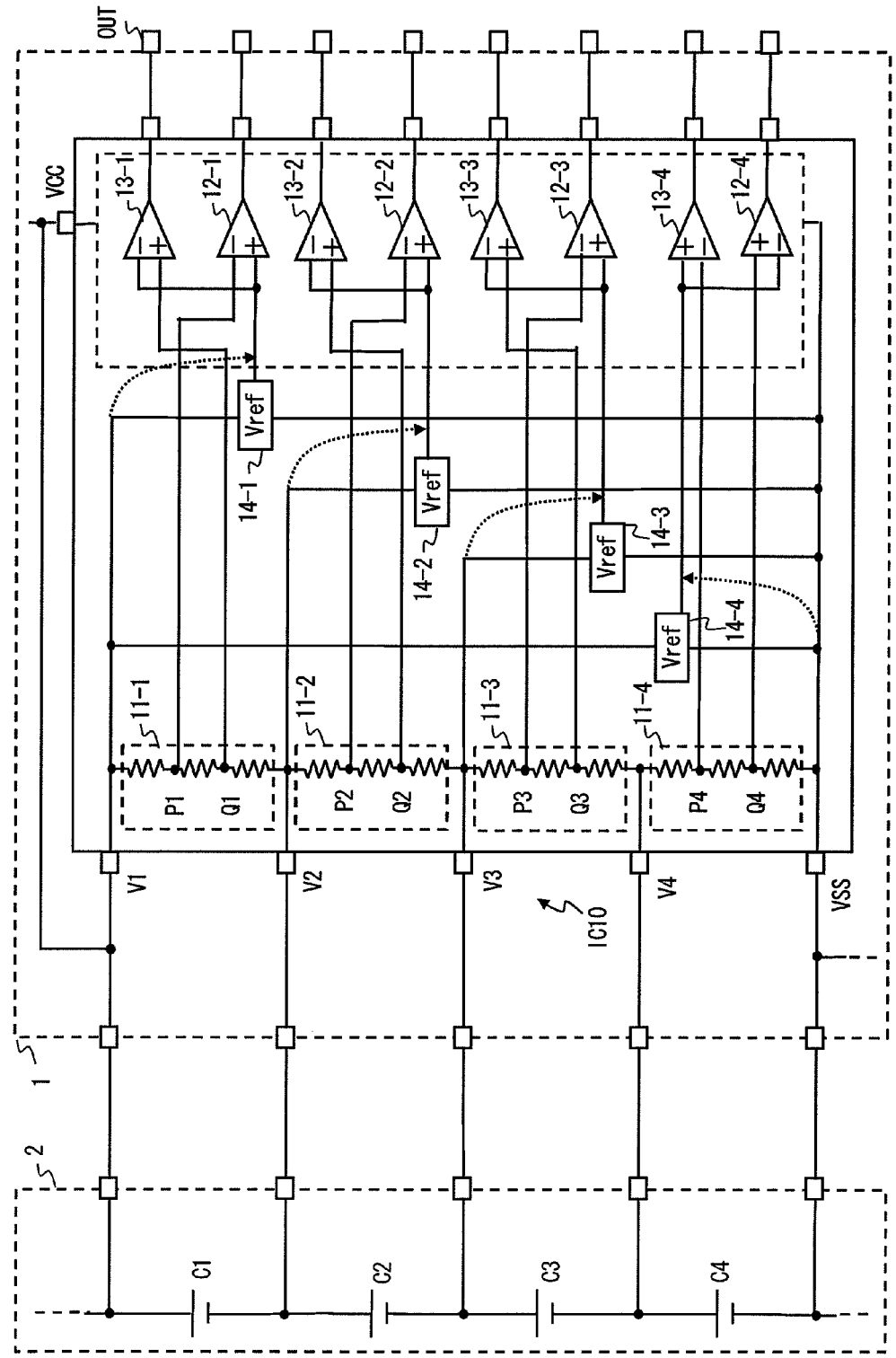
FIG. 1 is a diagram showing a voltage monitoring apparatus according to a first embodiment of the present invention.

Hereinafter, embodiments of the present invention will be described with reference to the drawings. FIG. 1 is a schematic diagram showing a voltage monitoring apparatus 1 according to a first embodiment of the present invention. The voltage monitoring apparatus 1 according to the first embodiment includes a plurality of voltage sensor modules. In this case, each voltage sensor module is a device having one or a plurality of voltage sensors to be modularized. In the first embodiment, a single module is formed of a single semiconductor device (IC). To simplify the drawing, FIG. 1 shows only one of the voltage sensor modules. The first embodiment will be described below with an example where a single voltage sensor module (IC) detects voltages of four battery cells. Note that the battery cell herein described does not necessarily mean a single battery. When a plurality of batteries are connected to each other between adjacent terminals of the voltage sensor module, the plurality of batteries are also called a battery cell.

As shown in FIG. 1, in the first embodiment, four battery cells C1 to C4 to be monitored by a voltage sensor module 10 (hereinafter, also referred to as "IC") are connected in series. Positive electrodes of the battery cells are connected to module input terminals V1 to V4 of the voltage sensor module 10 via external terminals of a battery pack 2 and input terminals of the voltage monitoring apparatus 1. In this case, the voltage sensor module 10 operates with a potential on a positive electrode side of the battery cell C1 being used as a first power supply potential (upper power supply potential) and with a potential on a negative electrode side of the battery cell C4 being used as a second power supply potential (ground potential). Accordingly, the positive electrode of the battery cell C1 is also connected to a first power supply terminal VCC. The negative electrode of the battery cell C4 is connected to a second power supply terminal VSS of the IC10.

In the voltage monitoring apparatus 1 configured as above, the IC10 measures voltages output by the battery cells (C1 to C4). The IC10 outputs an overvoltage detection signal or an undervoltage detection signal when each voltage of the battery cells becomes overvoltage or undervoltage. The voltage monitoring apparatus 1 monitors the voltages of the battery cells based on the overvoltage detection signal and the undervoltage detection signal. The voltage monitoring apparatus 1 outputs signals indicating each that the voltage of the battery cell is abnormal, from output terminals OUT of the voltage monitoring apparatus 1, the output terminals OUT being connected to output terminals of the IC10. Note that FIG. 1 shows that the output terminals of the IC10 are connected to the output terminals of the voltage monitoring apparatus 1 in one-to-one correspondence, but signals are not necessarily output in one-to-one correspondence. For example, in the IC10 or in the voltage monitoring apparatus 1, a plurality of output terminals can be combined into one output terminal by using an OR circuit or the like. The configuration of the IC10 used for the voltage monitoring apparatus 1 will be described in detail below.

As shown in FIG. 1, the voltage sensor module according to the first embodiment includes voltage dividing resistors 11, overvoltage detection comparators 12, undervoltage detection comparators 13, and reference voltage generation circuits 14. In the first embodiment, since a single voltage sensor module detects the overvoltage and undervoltage conditions of each of the four battery cells, there are provided four voltage dividing resistors 11-1 to 11-4, four overvoltage detection comparators 12-1 to 12-4, four undervoltage detection comparators 13-1 to 13-4, and four reference voltage generation circuits 14-1 to 14-4.

The voltage dividing resistors 11-1 to 11-4 each include three resistors connected in series between adjacent terminals of the IC10. The three resistors divide a voltage (voltage of battery cell) applied between the adjacent terminals. In the resistor string 11-1, for example, a voltage at a voltage dividing point P1 is set to be larger than a voltage at a voltage dividing point Q1.

The overvoltage detection comparators 12-1 to 12-4 each compare a voltage (regulated voltage) at a voltage dividing point (points P1 to P3, Q4) with a reference voltage. The overvoltage detection comparators 12-1 to 12-3 each output the overvoltage detection signal when the voltage at the voltage dividing point is lower than the reference voltage. The overvoltage detection comparator 12-4 outputs the overvoltage detection signal when the voltage at the voltage dividing point is higher than the reference voltage.

The undervoltage detection comparators 13-1 to 13-4 each compare a voltage (regulated voltage) at a voltage dividing point (points Q1 to Q3, P4) with a reference voltage. The undervoltage detection comparators 13-1 to 13-3 each output the undervoltage detection signal when the voltage at the voltage dividing point is higher than the reference voltage. The undervoltage detection comparator 13-4 outputs the undervoltage detection signal when the voltage at the voltage dividing point is lower than the reference voltage.

The reference voltage generation circuits 14-1 to 14-4 each generate the reference voltage and supply the reference voltage to each of the comparators.

A first voltage dividing point P1 of the voltage dividing resistor 11-1 is connected to an inverting input terminal of the overvoltage detection comparator 12-1. A second voltage dividing point Q1 of the voltage dividing resistor 11-1 is connected to a non-inverting input terminal of the undervoltage detection comparator 13-1. A voltage Vref output from the reference voltage generation circuit 14-1 is connected to each of a non-inverting input terminal of the overvoltage detection comparator 12-1 and an inverting input terminal of the undervoltage detection comparator 13-1.

Similarly, first voltage dividing points P2 and P3 of the voltage dividing resistors 11-2 and 11-3 are connected to inverting input terminals of the overvoltage detection comparators 12-2 and 12-3, respectively. Second voltage dividing points Q2 and Q3 of the voltage dividing resistors 11-2 and 11-3 are connected to non-inverting input terminals of the undervoltage detection comparators 13-2 and 13-3, respectively. A voltage Vref output from the reference voltage generation circuit 14-2 and a voltage Vref output from the reference voltage generation circuit 14-3 are connected to non-inverting input terminals of the overvoltage detection comparators 12-2 and 12-3, respectively, and are also connected to inverting input terminals of the undervoltage detection comparators 13-2 and 13-3, respectively.

In the first embodiment, a first voltage dividing point P4 of the voltage dividing resistor 11-4 is connected to an inverting input terminal of the undervoltage detection comparator 13-4. A second voltage dividing point Q4 of the voltage dividing resistor 11-4 is connected to a non-inverting input terminal of the overvoltage detection comparator 12-4. A voltage Vref output from the reference voltage generation circuit 14-4 is connected to each of an inverting input terminal of the overvoltage detection comparator 12-4 and a non-inverting input terminal of the undervoltage detection comparator 13-4.

Here, in the first embodiment, the reference voltage generation circuits 14-1 to 14-4 each generate the reference voltage Vref by using voltages output by at least two battery cells. In the first embodiment, as indicated by the dashed lines of FIG. 1, the reference voltage generation circuit 14-1 generates the reference voltage Vref based on a potential at the terminal V1 by using a voltage between the terminals V1 and VSS (voltage between first terminal and second terminal). The reference voltage generation circuit 14-2 generates the reference voltage Vref based on a potential at the terminal V2 by using a voltage between the terminals V2 and VSS. The reference voltage generation circuit 14-3 generates the reference voltage Vref based on a potential at the terminal V3 by using a voltage between the terminals V3 and VSS. The reference voltage generation circuit 14-4 generates the reference voltage Vref based on a potential at the power supply terminal VSS by using a voltage between the terminals V1 and VSS. Any type of circuit may be used as the reference voltage generation circuit as long as the circuit is capable of generating the reference voltage by using voltages output by at least two battery cells.

The overvoltage detection comparators 12-1 to 12-4 and the undervoltage detection comparators 13-1 to 13-4 are circuits that operate with a power supply voltage (voltage between VCC and VSS) of the IC10 being used as a power supply voltage.

Figure 2:
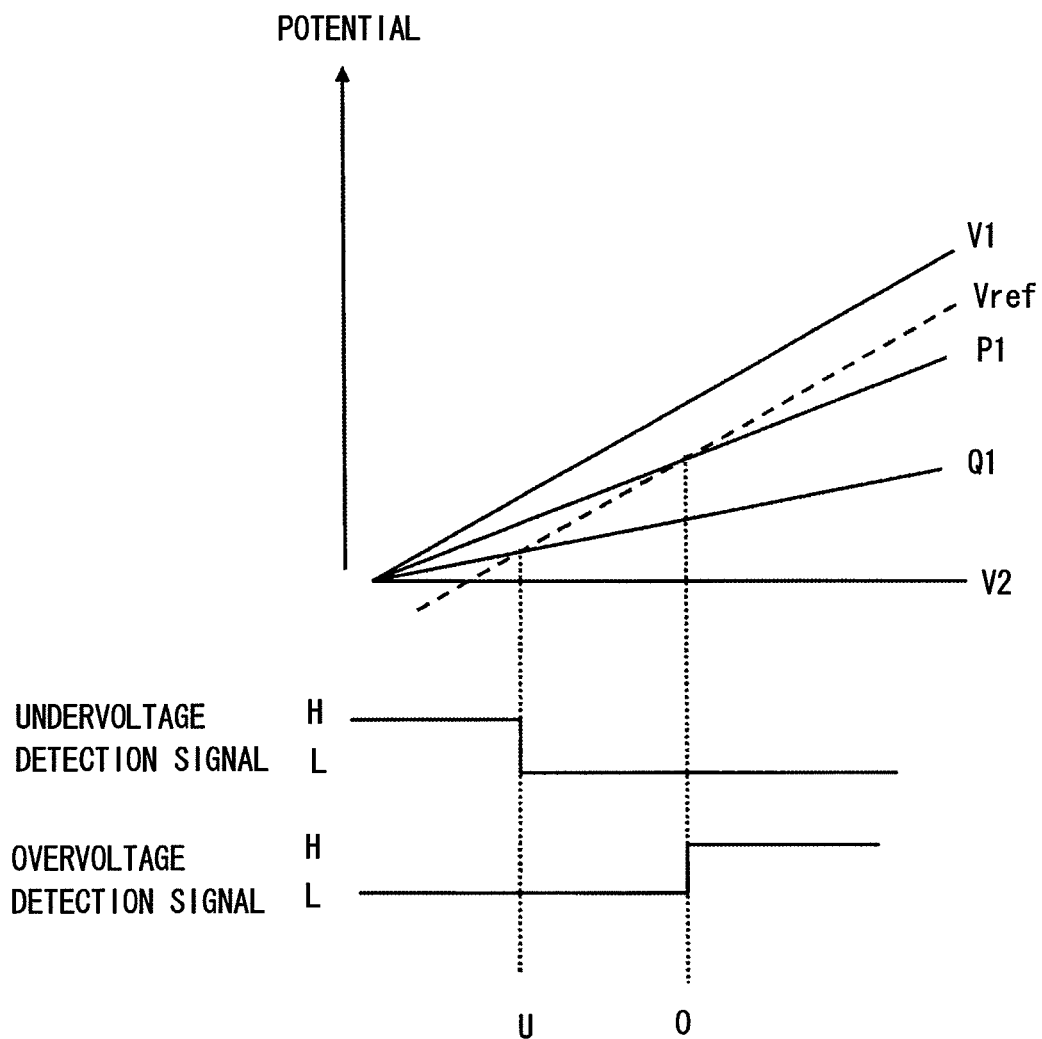
FIG. 2 is a graph showing a relation between a potential obtained in overvoltage detection and a potential obtained in undervoltage detection.

Operations of the IC10 configured as above will be described below with reference to FIG. 2. FIG. 2 is a graph showing a relation between potentials at the points P1 and Q1, and outputs of the overvoltage detection signal and the undervoltage detection signal, by taking the terminal V1 as an example. FIG. 2 shows only the potentials at the points V1, P1, and Q1, but the same holds true for the potentials at the points P2, Q2, and the like. The overvoltage detection comparators 12-1 to 12-3 each output the "H" level signal when a voltage at each of the voltage dividing points P1 to P3, which are respectively connected to the overvoltage detection comparators 12-1 to 12-3, is lower than the reference voltage Vref (see point O of FIG. 2). The undervoltage detection comparators 13-1 to 13-3 each output the "H" level signal when a voltage at each of the voltage dividing points Q1 to Q3, which are respectively connected to the undervoltage detection comparators 13-1 to 13-3, is higher than the reference voltage Vref (see point U of FIG. 2). The overvoltage detection comparator 12-4 outputs the "H" level signal when a voltage at the voltage dividing point Q4 is higher than the reference voltage Vref. The undervoltage detection comparator 13-4 outputs the "H" level signal when a voltage at the voltage dividing point P4 is lower than the reference voltage Vref.

A description is given of a case where, in the voltage monitoring apparatus shown in FIG. 1, a voltage between the terminals V1 and V2 (voltage between third terminal and fourth terminal) of the IC10 decreases. When the output voltage of the battery cell C1 decreases, the potential at the voltage dividing point Q1 of the voltage dividing resistor 11-1 also decreases. In this case, the reference voltage Vref to be compared is generated with reference to a potential difference between the terminals V1 and VSS. With this configuration, even when the voltage between the terminals V1 and V2 to be monitored decreases, a desired reference voltage Vref can be generated. In other words, the voltage between the terminals V1 and VSS is determined based on the output voltage of each of the four battery cells C1 to C4. Even in a case where the output voltage of the battery cell C1 to be monitored, which is included in the four battery cells, decreases, when a total output voltage of the other battery cells C2 to C4 corresponds to an output voltage high enough to generate the desired reference voltage, undervoltage detection can be normally performed.

Similarly, even when the voltage between the terminals V2 and V3 of the IC10 decreases, since the reference voltage is generated with reference to a potential difference between the terminals V2 and VSS, the reference voltage can be generated unless the output voltage of each of the battery cells C3 and C4 decreases.

Note that, in the first embodiment, the reference voltage generation circuit 14-1 is connected between the terminals V1 and VSS. When thus connected, the reference voltage generation circuit 14-1 can generate the reference voltage with the potential at the terminal V1 as a reference. Similarly, the reference voltage generation circuit 14-2, which is connected between the terminals V2 and VSS, generates a reference voltage with a potential at the terminal V2 as a reference, and the reference voltage generation circuit 14-3, which is connected between the terminals V3 and VSS, generates a reference voltage with a potential at the terminal V3 as a reference. Note that, in the reference voltage generation circuit 14-4, when the potential at the terminal V4 is used for generation of the reference voltage Vref, it is necessary to connect the reference voltage generation circuit 14-4 between the terminals V4 and VSS. When the reference voltage generation circuit 14-1 is thus connected, if the output voltage of the battery cell C4 decreases, there is a fear that a malfunction may occur as in the conventional case. Accordingly, the reference voltage generation circuit 14-4 is connected between the terminals V1 and VSS so as to generate the reference voltage Vref with a potential at the ground terminal VSS as a reference. By connecting the reference voltage generation circuit 14-4 in this manner, even when the output voltage of the battery cell C4 decreases, a stable reference voltage can be generated.

As described above, in the first embodiment, the reference voltages to be input to each of the overvoltage detection comparators and the undervoltage detection comparators are generated based on the output voltages of the plurality of battery cells. It is highly unlikely that the output voltages of the plurality of battery cells decrease at the same time. Accordingly, by connecting the reference voltage generation circuits in the above-mentioned manner, it is possible to greatly reduce the possibility of occurrence of a malfunction.

Figure 3:
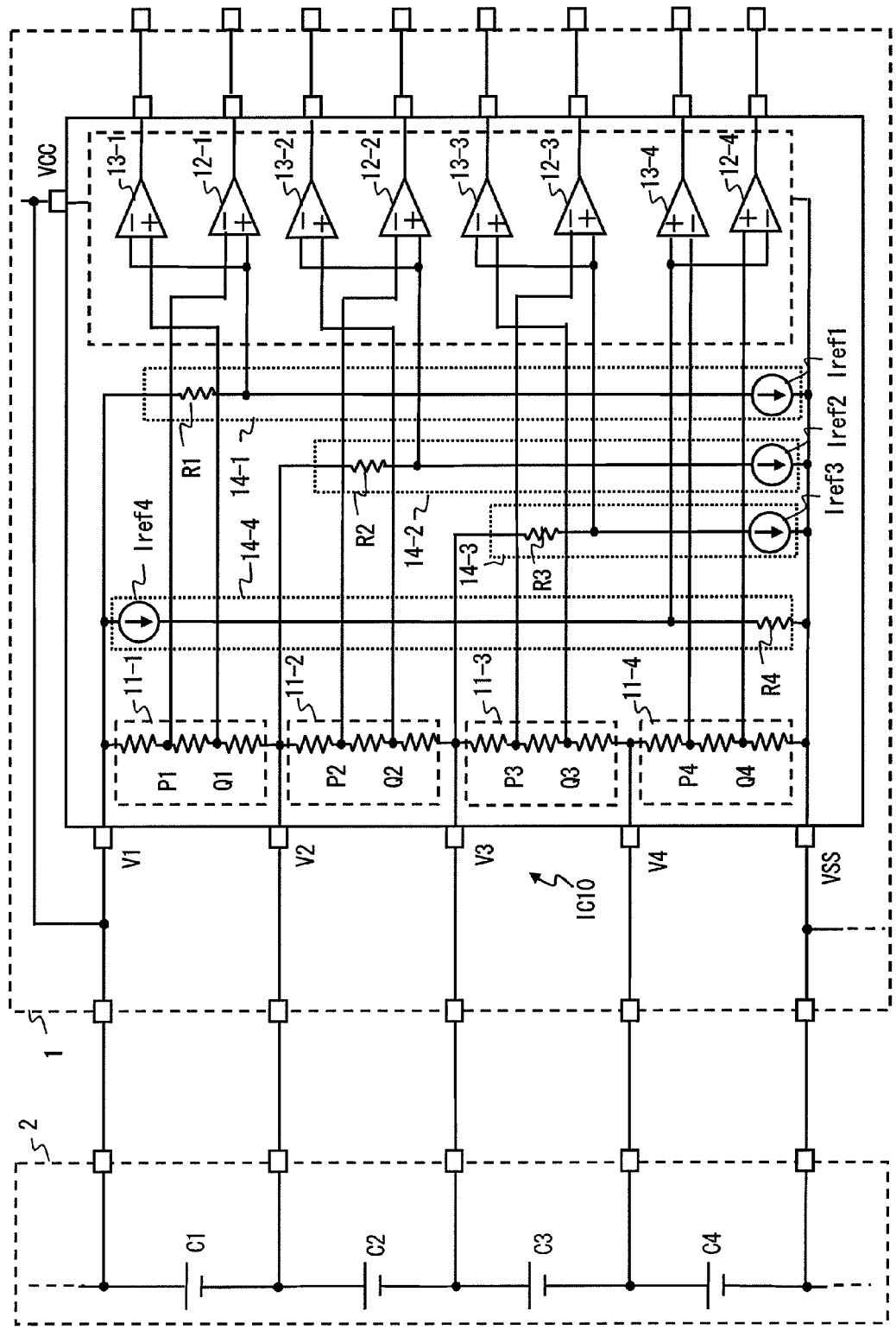
FIG. 3 is a diagram showing a voltage monitoring apparatus according to the first embodiment.

FIG. 3 is a diagram showing an example of each of the reference voltage generation circuits 14-1 to 14-4 described above with reference to FIG. 1. In the circuit shown in FIG. 3, the reference voltages are generated using current sources Iref1 to Iref4 and resistors R1 to R4. In FIG. 3, each of the current sources Iref1 to Iref3 is a current source of a type which causes a current to flow into the terminal VSS. The current source Iref4 is a current source of a type which causes a current to flow out of the terminal V1. The current from the terminal V1 of the IC10 is flown into the reference voltage generation circuit 14-1. The reference voltage Vref becomes a value obtained by subtracting a voltage equivalent to a voltage drop due to the resistor R1 from the potential at the terminal V1. Similarly, in the reference voltage generation circuit 14-2, a value obtained by subtracting a voltage equivalent to a voltage drop due to the resistor R2 from the potential at the terminal V2 is determined as a reference voltage, and in the reference voltage generation circuit 14-3, a value obtained by subtracting a voltage equivalent to a voltage drop due to the resistor R3 from the potential at the terminal V3 is determined as a reference voltage. In the reference voltage generation circuit 14-4, a value which is obtained by adding a voltage equivalent to a voltage rise due to the resistor R4 to the potential at the terminal VSS is determined as a reference voltage.

Figure 4:
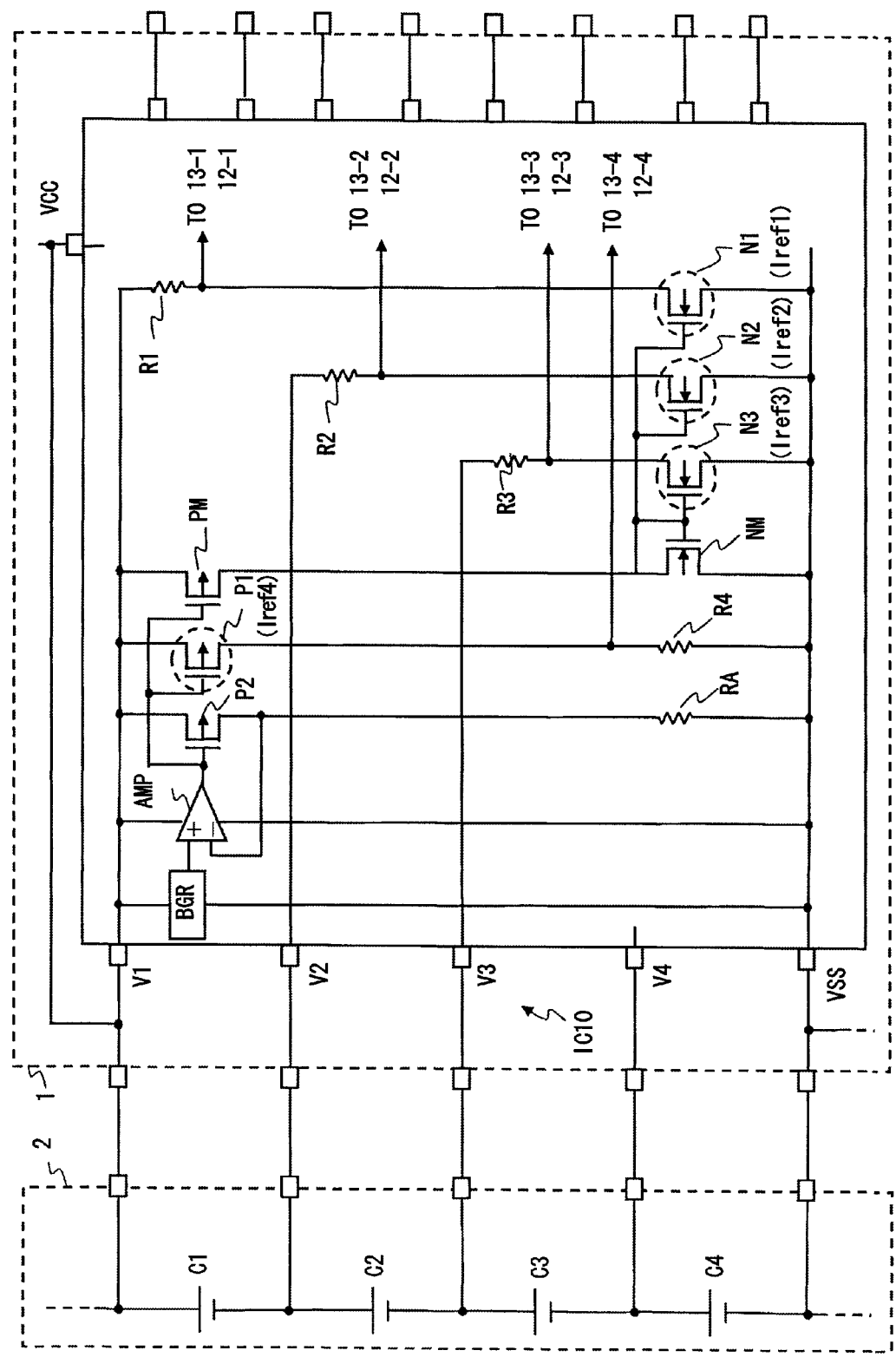
FIG. 4 is a diagram showing a reference voltage generation circuit.

FIG. 4 shows an example of each of the reference voltage generation circuits 14-1 to 14-4 shown in FIG. 3. To simplify the drawing, FIG. 4 shows only the configuration corresponding to the reference voltage generation circuits 14-1 to 14-4, while other parts are omitted. As shown in FIG. 4, the reference voltage generation circuits 14-1 to 14-3 of the first embodiment include a bandgap reference circuit BGR, an amplifier AMP, PMOS transistors PM, P1, and P2, NMOS transistors NM and N1 to N3, and resistors R1 to R4 and RA. Note that the resistors R1 to R4 are identical with the resistors R1 to R4 shown in FIG. 3.

In this case, the PMOS transistor PM and the NMOS transistor NM are connected in series between the terminals VCC and VSS. The NMOS transistors N1 to N3 are current-mirror connected to the NMOS transistor NM. The PMOS transistor P1 and the resistor R4 are connected in series between the terminals VCC and VSS. Also, the PMOS transistor P2 and the resistor RA are connected in series between the terminals VCC and VSS. An output of the bandgap reference circuit BGR is applied to a non-inverting input terminal of the amplifier, and a node between the PMOS transistor P2 and the resistor RA is connected to an inverting input terminal of the amplifier. An output of the amplifier is applied to each gate of the PMOS transistors PM, P1, and P2.

In the reference voltage generation circuits configured as above, the NMOS transistors N1 to N3 correspond to the current sources Iref1 to Iref3 shown in FIG. 3, respectively. The PMOS transistor P1 corresponds to the current source Iref4. Through each of the NMOS transistors N1 to N3 that are current-mirror connected to the NMOS transistor NM, a current equivalent to a reference current flowing through the PMOS transistor PM flows. The resistor R1 and the NMOS transistor N1 are connected between the terminals V1 and VSS. Accordingly, a potential which is obtained by subtracting a voltage equivalent to a voltage drop due to the resistor R1 from the potential at the terminal V1 is output. In other words, a potential at a node between the resistor R1 and the NMOS transistor N1 corresponds to an output of the reference voltage generation circuit 14-1 shown in FIG. 3. Similarly, a potential at a node between the resistor R2 and the NMOS transistor N2 corresponds to an output of the reference voltage generation circuit 14-2, and a potential at a node between the resistor R3 and the NMOS transistor N3 corresponds to an output of the reference voltage generation circuit 14-3. An output of the reference voltage generation circuit 14-4 corresponds to a potential at a node between the PMOS transistor P1 and the resistor R4.

In other words, in the first embodiment, the reference voltage generation circuits operate as a whole with a voltage between the terminals VCC and VSS being used as a power supply voltage, while the reference voltage applied to the voltage sensor is generated using the voltages between the plurality of battery cells (for example, voltage between V1 and VSS and voltage between V2 and VSS). In this configuration, the reference voltages to be input to the overvoltage detection comparators and the undervoltage detection comparators as described above with reference to FIGS. 1 to 3 are generated based on the output voltages of the plurality of battery cells.

Figure 5:
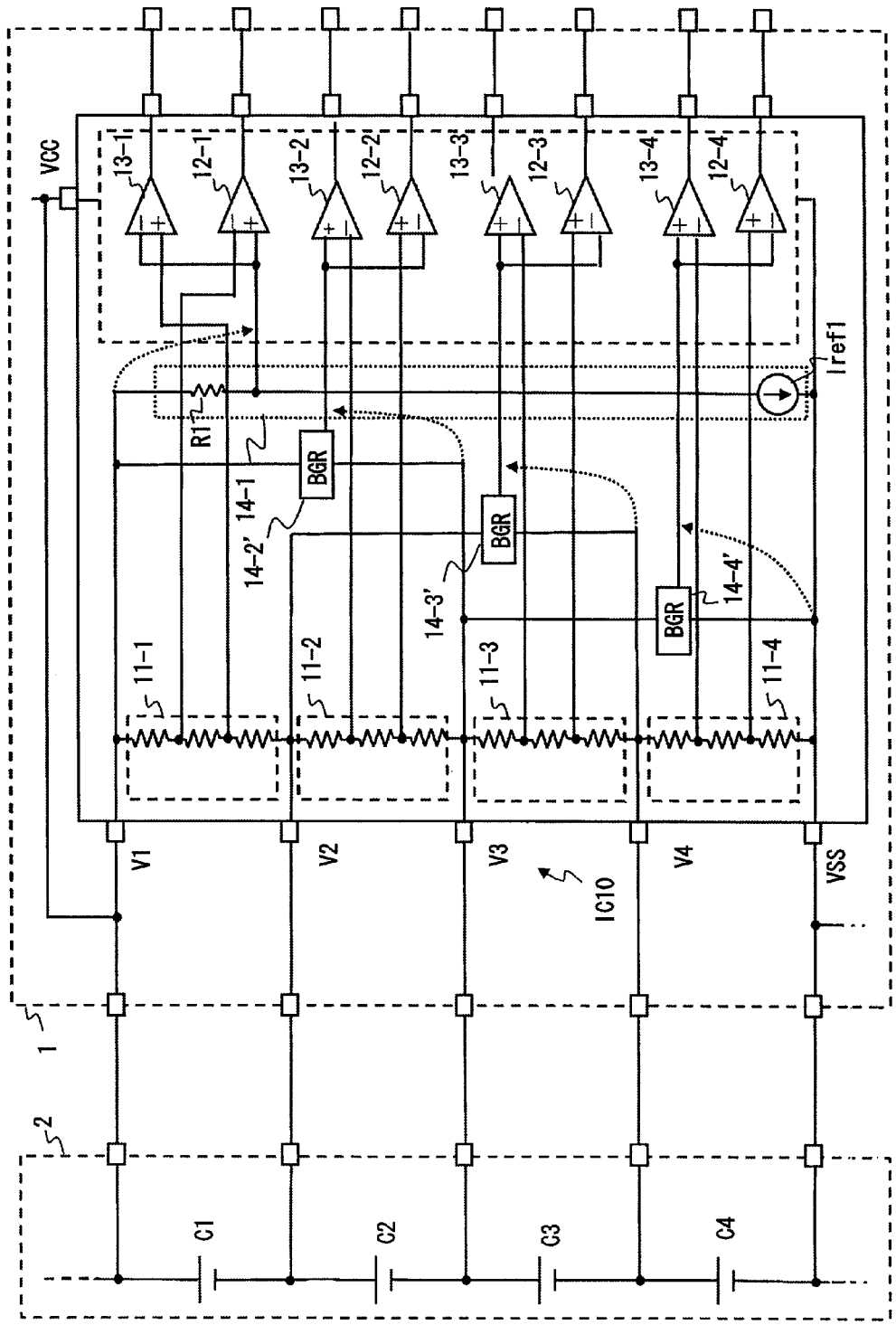
FIG. 5 is a diagram showing a modified example of the voltage monitoring apparatus according to the first embodiment.

Note that FIGS. 1 and 3 each illustrate the circuits for generating the reference voltage by using the potential at each of the terminals V1, V2, V3, and VSS as a reference. Alternatively, in the first embodiment, various reference voltage generation circuits can be used. FIG. 5 shows a modified example of the voltage monitoring apparatus according to the first embodiment.

In the circuits shown in FIG. 5, the reference voltage generation circuit 14-1 has a configuration similar to that of FIG. 3. A reference voltage generation circuit 14-2' is formed of a bandgap reference circuit (BGR circuit) connected between the terminals V1 and V3. Similarly, a reference voltage generation circuit 14-3' is formed of a BGR circuit connected between the terminals V2 and V4, and a reference voltage generation circuit 14-4' is formed of a BGR circuit connected between the terminals V3 and VSS. Thus, when the bandgap reference circuits are used, the reference voltage generation circuits 14-2', 14-3', and 14-4' generate the reference voltages with the potentials at the terminals V3, V4, and VSS being used as references, respectively. Relations between each potential as the reference and each Vref are indicated by dashed arrows of FIG. 5 in the same manner as in FIG. 1. Note that, in a case where the voltage Vref used as the reference to be compared is generated with the terminal on a lower potential side as a reference, the voltage dividing resistors and the reference voltage generation circuits are connected with the input terminals of the overvoltage detection comparators and the undervoltage detection comparators in a manner as shown in FIG. 5 so that a logic of "H" is obtained when an abnormality is detected. Thus, various modifications can be made as long as the circuit generates the reference voltage with reference to the output voltages of the plurality of battery cells.

Second Embodiment

Figure 9:
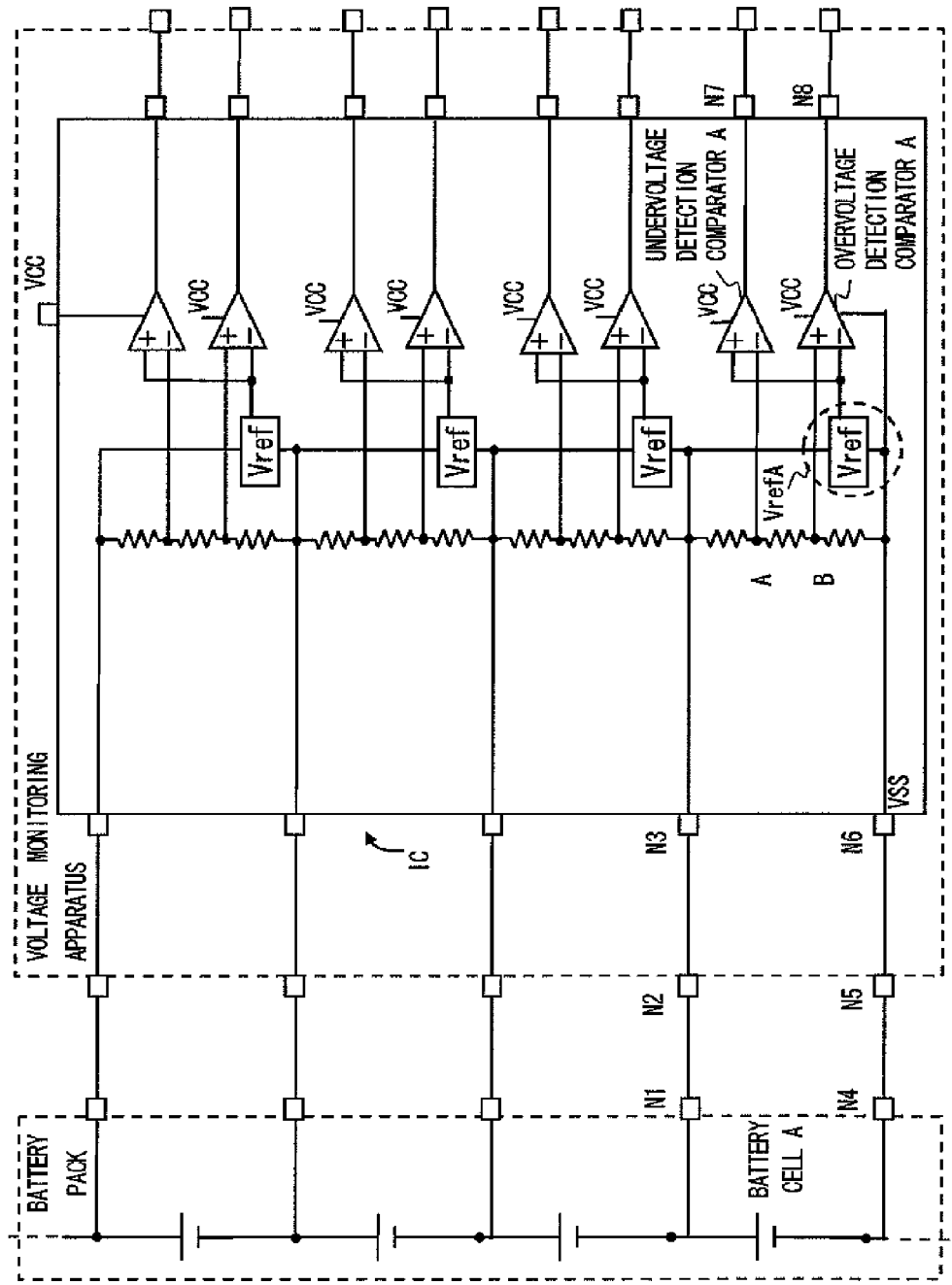
FIG. 9 is a diagram showing a voltage sensor module of the related art.
Figure 10:
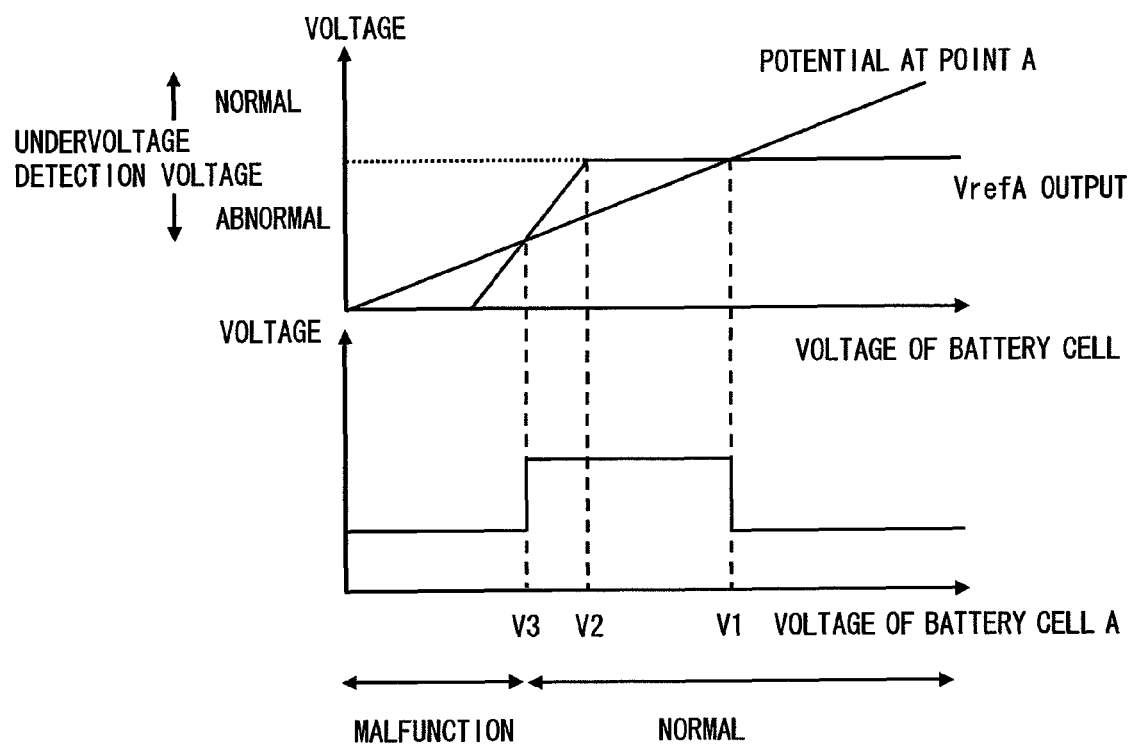
FIG. 10 is a graph showing a relation between a reference voltage output and a battery cell voltage.

In general, a reference voltage generation circuit is designed such that an output voltage thereof does not vary depending on the magnitude of a power supply voltage of the circuit, but actually, the output voltage inevitably varies and is affected by the magnitude of the power supply voltage to some degree. As shown in FIG. 9, in a case of generating the reference voltage Vref with reference to a voltage of a single battery cell serving as an abnormality detection target, the voltage referred to by the reference voltage generation circuit is constantly equal to an abnormality detection set voltage. For this reason, the reference voltage Vref obtained during the time of detecting an abnormality is a constant voltage at any time. In the voltage monitoring apparatus according to the first embodiment, the reference voltage generation circuits each generate the reference voltage Vref with reference to the voltages of the plurality of battery cells including the battery cell serving as the abnormality detection target. Accordingly, depending on the magnitude of each voltage of the other battery cells which are not abnormality detection targets, the reference voltage Vref varies. When the reference voltage, which should be kept constant, varies, the accuracy of the voltage detection is deteriorated. In a second embodiment of the present invention, the undervoltage detection is performed using the reference voltage Vref1 generated with reference to the voltages of the plurality of battery cells and also using the reference voltage Vref2 generated with reference to the voltage of a single battery cell.

Figure 6:
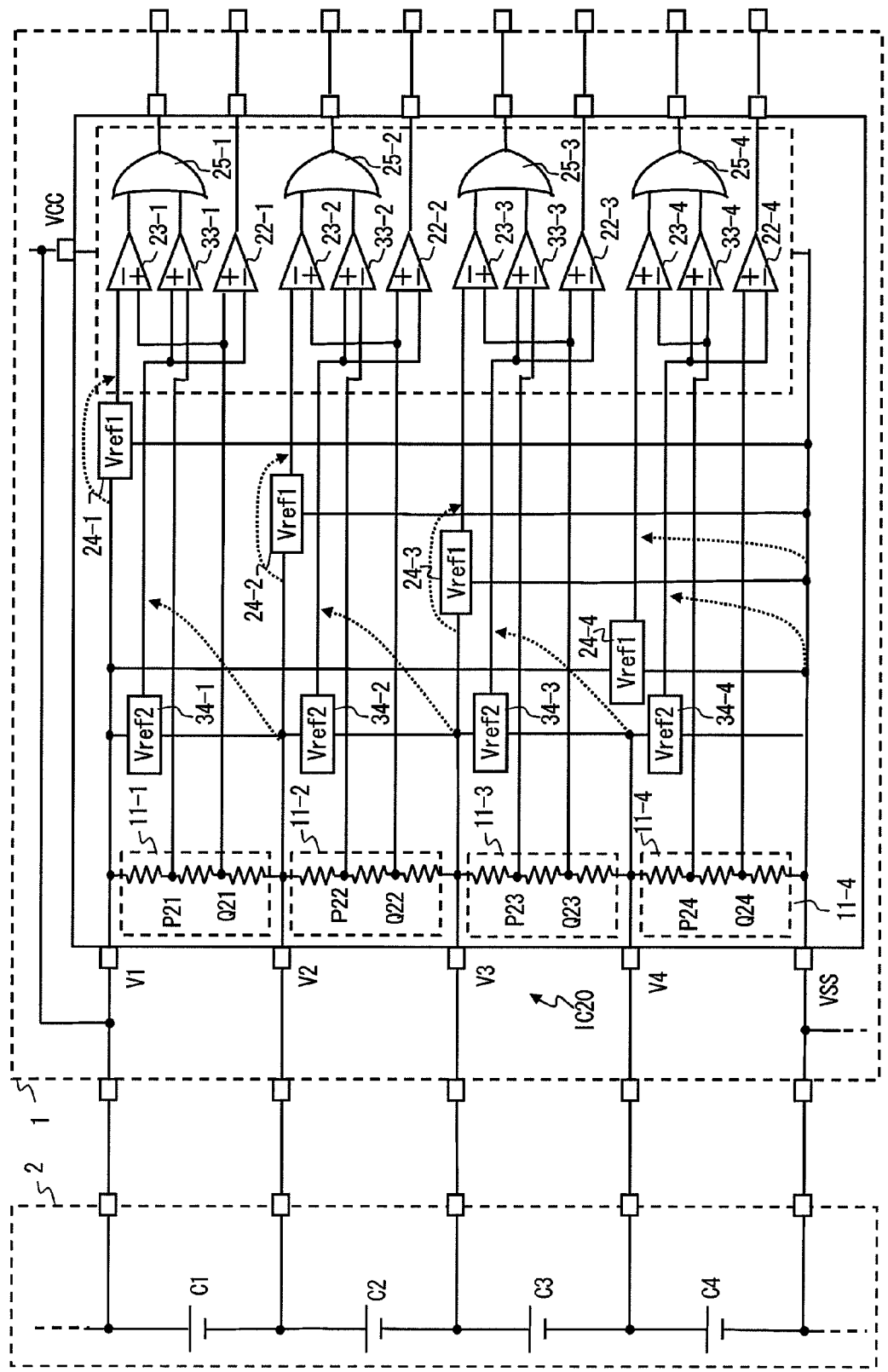
FIG. 6 is a diagram showing a voltage monitoring apparatus according to a second embodiment of the present invention.

FIG. 6 is a schematic diagram showing a voltage monitoring apparatus according to the second embodiment of the present invention. The voltage monitoring apparatus of the second embodiment will be described below with reference to FIG. 6. Note that components common to those of FIGS. 1 to 5 are denoted by the same reference symbols, and a detailed description thereof is omitted.

In the second embodiment, an IC20 includes overvoltage detection comparators 22-1 to 22-4, first undervoltage detection comparators 23-1 to 23-4, second undervoltage detection comparators 33-1 to 33-4, first reference voltage generation circuits 24-1 to 24-4, second reference voltage generation circuits 34-1 to 34-4, and OR gates 25-1 to 25-4.

In the second embodiment, the first reference voltage generation circuits 24-1 to 24-4 are reference voltage generation circuits for generating a reference voltage with reference to output voltages of at least two battery cells in a similar manner as in the first embodiment. The second reference voltage generation circuits 34-1 to 34-4 are reference voltage generation circuits for generating a reference voltage with reference to an output voltage of a single battery cell to be monitored. The first reference voltage generation circuits 24-1 to 24-4 and the second reference voltage generation circuits 34-1 to 34-4 generate a first reference voltage and a second reference voltage, respectively, and supply the reference voltage to each of the comparators.

The overvoltage detection comparators 22-1 to 22-4 each compare a voltage at each voltage dividing point (points Q21 to Q24) with the reference voltage generated by each of the second reference voltage generation circuits 34-1 to 34-4. The overvoltage detection comparators 22-1 to 22-4 each output the overvoltage detection signal when the voltage at the voltage diving point is higher than the reference voltage.

The first undervoltage detection comparators 23-1 to 23-4 each compare a voltage at each voltage dividing point (for example, points Q21 to Q23, P24) with the reference voltage generated by each of the first reference voltage generation circuits. The undervoltage detection comparators 23-1 to 23-3 each output the undervoltage detection signal when the voltage at the voltage dividing point is higher than the reference voltage. The undervoltage detection comparator 23-4 outputs the undervoltage detection signal when the voltage at the voltage dividing point is lower than the reference voltage.

The second undervoltage detection comparators 33-1 to 33-4 each compare a voltage at each voltage dividing point (for example, points P21 to P24) with the reference voltage generated by each of the second reference voltage generation circuits. The second undervoltage detection comparators 33-1 to 33-4 each output the undervoltage detection signal when the voltage at the voltage dividing point is lower than the reference voltage.

A first voltage dividing point P21 of the voltage dividing resistor 11-1 is connected to an inverting input terminal of the second undervoltage detection comparator 33-1. A second voltage dividing point Q21 of the voltage dividing resistor 11-1 is connected to each of a non-inverting input terminal of the first undervoltage detection comparator 23-1 and a non-inverting input terminal of the overvoltage detection comparator 22-1.

Similarly, first voltage dividing points P22 and P23 of the voltage dividing resistors 11-2 and 11-3 are connected to inverting input terminals of the second undervoltage detection comparators 33-2 and 33-3, respectively. Second voltage dividing points Q22 and Q23 of the voltage dividing resistors 11-2 and 11-3 are connected to non-inverting input terminals of the first undervoltage detection comparators 23-2 and 23-3, respectively, and are also connected to non-inverting input terminals of the overvoltage detection comparators 22-2 and 22-3, respectively.

In the second embodiment, a first voltage dividing point P24 of the voltage dividing resistor 11-4 is connected to inverting input terminals of the first undervoltage detection comparator 23-4 and the second undervoltage detection comparator 33-4. A second voltage dividing point Q24 of the voltage dividing resistor 11-4 is connected to a non-inverting input terminal of the overvoltage detection comparator 22-4.

The OR gates 25-1 to 25-4 are connected to outputs of the first undervoltage detection comparators 23-1 to 23-4, respectively, and are also connected to outputs of the second undervoltage detection comparators 33-1 to 33-4, respectively. The OR gates each output the undervoltage detection signal when the first undervoltage detection comparator or the second undervoltage detection comparator detects the undervoltage condition. Operations of the voltage monitoring apparatus configured as above will be described below.

Figure 7:
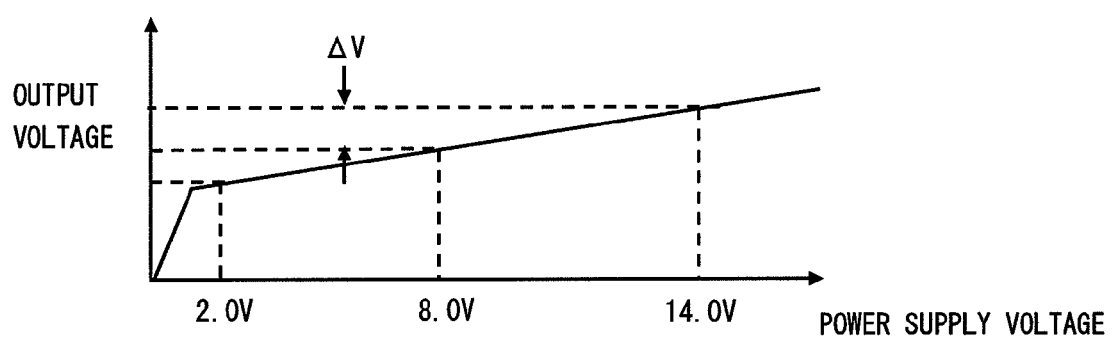
FIG. 7 is a graph showing a relation between an output voltage and a power supply voltage of a reference voltage generation circuit.
Figure 8:
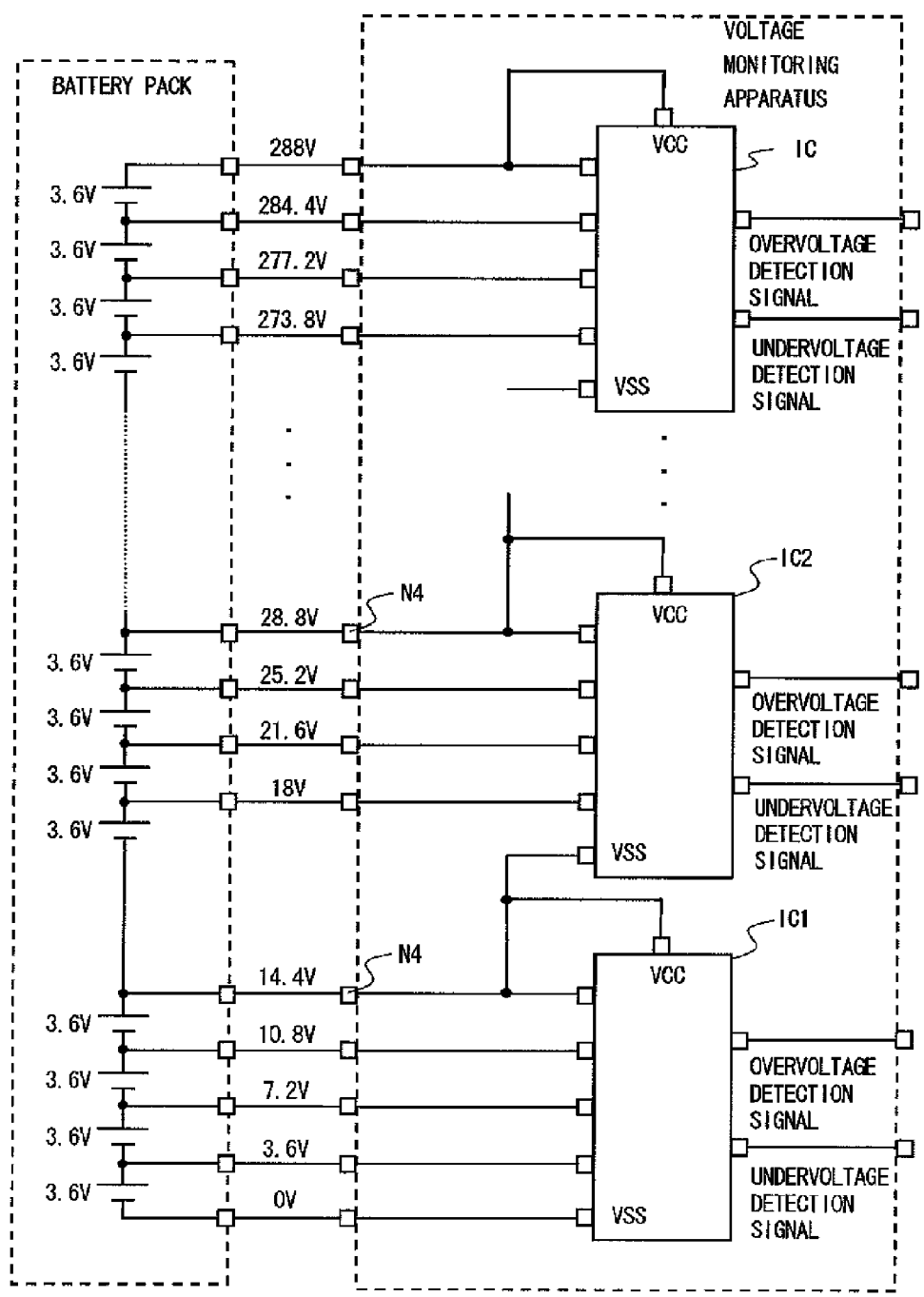
FIG. 8 is a diagram showing a voltage monitoring apparatus of a related art.

FIG. 7 shows a relation between an output voltage and a power supply voltage of a first reference voltage generation circuit. In this case, it is assumed that a normal output voltage range of a single battery cell is from 2.0 V to 4.0 V. Accordingly, when the output of the battery cell is equal to or lower than 2.0 V, it is determined as abnormal undervoltage, and when the output is equal to or larger than 4.0 V, it is determined as abnormal overvoltage. It is also assumed that the first reference voltage generation circuit generates the reference voltage with reference to the outputs of four battery cells, and the second reference voltage generation circuit generates the reference voltage with reference to the output of a single battery cell.

A description is given of an example of the reference voltage obtained during the undervoltage detection. When the output of the battery cell to be monitored, for example, the battery cell C1 is smaller than 2.0 V, it is determined as abnormal undervoltage. In this case, a power supply voltage of the first reference voltage generation circuit 24-1 is in a range from 8.0 V to 14.0 V. As shown in FIG. 7, output voltage characteristics with respect to the power supply voltage of the first reference voltage generation circuit 24-1 generally show a slope, that is, power supply voltage dependence. Accordingly, the voltage output by the first reference voltage generation circuit 24-1 has a width represented by $\Delta V$ of FIG. 7. On the other hand, the second reference voltage generation circuit 34-1 refers to the output voltage of the battery cell C1 to be monitored. For this reason, when the output of the battery cell C1 to be monitored is 2.0 V, the power supply voltage of the second reference voltage generation circuit 34-1 inevitably becomes 2.0 V. Accordingly, the output voltage which is obtained during the time when the undervoltage detection comparator 33-1 detects an abnormality is kept constant.

Even when a malfunction occurs in the second undervoltage detection comparator 33-1 due to the undervoltage condition and the "L" level signal indicating the normal state is erroneously output, the undervoltage detection comparator 23-1 normally detects the undervoltage and outputs the "H" level signal in such a case, and the OR circuit 25-1 produces the "H" level output, whereby the abnormality detection can be normally performed. Further, a first undervoltage detection threshold is set to a voltage lower than a second undervoltage detection threshold and is set to a voltage higher than a voltage at which a second undervoltage detection comparator causes a malfunction, whereby the undervoltage detection can be performed with high accuracy by the second undervoltage detection comparator. In addition, a first undervoltage detection comparator detects the undervoltage condition before the voltage reaches a level at which the second undervoltage detection comparator causes a malfunction, and produces the "H" level output, whereby the undervoltage detection can be performed with high detection accuracy and without causing any malfunction.

While the present invention is described with reference to the embodiments in detail above, the present invention is not limited to the above embodiments, and various modifications can be made.

It is apparent that the present invention is not limited to the above embodiments, but may be modified and changed without departing from the scope and spirit of the invention.

What is claimed is:

1. A voltage sensor module monitoring a voltage of each of a plurality of battery cells, comprising:

a first terminal and a second terminal each to receive a voltage applied between both ends of the plurality of battery cells;

a third terminal and a fourth terminal each to receive a voltage applied between both ends of a battery cell to be monitored which is included in the plurality of battery cells;

a plurality of reference voltage generation circuits, each of the plurality of reference voltage generation circuits corresponding to one of the plurality of battery cells and generating a reference voltage for monitoring the battery cell;

a first reference voltage generation circuit, from among the plurality of reference voltage generation circuits, connected to each of the first terminal and the second terminal and to generate a first reference voltage based on the voltage applied between the both ends of the plurality of battery cells; and a first comparator circuit to compare a first regulated voltage generated based on a voltage applied between the third terminal and the fourth terminal, with the first reference voltage;

a fifth terminal and a sixth terminal each receiving a voltage applied between both ends of another battery cell to be monitored which is included in the plurality of battery cells;

a second reference voltage generation circuit connected to each of a seventh terminal and an eighth terminal and generating a second reference voltage based on the voltage applied between the both ends of the plurality of battery cells; and a second comparator circuit comparing a second regulated voltage generated based on a voltage applied between the fifth terminal and the sixth terminal, with the second reference voltage, wherein all reference voltages generated by the plurality of reference voltage generation circuits for monitoring the plurality of battery cells are generated based on a voltage applied between both ends of at least two battery cells included in the plurality of cells, the all reference voltages including the first and second reference voltages.

2. The voltage sensor module according to claim 1, wherein one of the first terminal and the second terminal is identical with one of the third terminal and the fourth terminal.

3. The voltage sensor module according to claim 1, wherein the first comparator circuit is a circuit outputting an undervoltage detection signal when an output voltage of the battery cell is equal to or lower than a preset value.

4. The voltage sensor module according to claim 1, wherein the first regulated voltage is generated by a resistor connected to each of the third terminal and the fourth terminal.

5. The voltage sensor module according to claim 1, wherein the first reference voltage generation circuit includes a current source and a resistor.

6. The voltage sensor module according to claim 5, wherein:
the current source comprises a current source of a type which causes a current to flow in; and
the first terminal is identical with one of the third terminal and the fourth terminal.

7. The voltage sensor module according to claim 5, wherein:
the current source comprises a current source of a type which causes a current to flow out; and
the first terminal is identical with one of the fifth terminal and the sixth terminal.

8. The voltage sensor module according to claim 1, wherein the first reference voltage generation circuit is a bandgap reference circuit.

9. The voltage sensor module according to claim 1, wherein one of the first terminal and the second terminal is identical with one of the fifth terminal and the sixth terminal.

10. The voltage sensor module according to claim 1, further comprising:
a third reference voltage generation circuit connected to each of the third terminal and the fourth terminal and generating a third reference voltage based on the voltage applied between the both ends of the plurality of battery cells; and
a third comparator circuit comparing the first regulated voltage generated based on the voltage applied between the third terminal and the fourth terminal, with the third reference voltage.

11. The voltage sensor module according to claim 10, wherein the third comparator circuit is a circuit outputting an undervoltage detection signal when an output voltage of the battery cell is equal to or lower than a preset value.

12. the voltage sensor module according to claim 10, further comprising a gate outputting the undervoltage detection signal to a post-stage circuit when one of the undervoltage detection signal of the first comparator circuit and the undervoltage detection signal of the third comparator circuit is input.

13. The voltage sensor module according to claim 10, wherein the first reference voltage is set to a value smaller than a value of the third reference voltage.

14. The voltage sensor module according to claim 10, further comprising a fourth comparator circuit comparing a third regulated voltage generated based on the voltage applied between the third terminal and the fourth terminal, with the first reference voltage,
wherein the fourth comparator circuit is a circuit outputting an undervoltage detection signal when an output voltage of the battery cell is equal to or larger than a preset value.

15. A voltage monitoring apparatus for a battery pack, comprising:
a plurality of voltage sensor modules monitoring a voltage of each of a plurality of battery cells, wherein the voltage sensor module comprising:
a first terminal and a second terminal each to receive a voltage applied between both ends of the plurality of battery cells;
a third terminal and a fourth terminal each to receive a voltage applied between both ends of a battery cell to be monitored which is included in the plurality of battery cells;
a plurality of reference voltage generation circuits, each of the plurality of reference voltage generation circuits corresponding to one of the plurality of battery cells and generating a reference voltage for monitoring the battery cell;
a first reference voltage generation circuit, from among the plurality of reference voltage generation circuits, connected to each of the first terminal and the second terminal and to generate a first reference voltage based on the voltage applied between the both ends of the plurality of battery cells;
a first comparator circuit to compare a first regulated voltage generated based on a voltage applied between the third terminal and the fourth terminal, with the first reference voltage;

a fifth terminal and a sixth terminal each receiving a voltage applied between both ends of another battery cell to be monitored which is included in the plurality of battery cells;

a second reference voltage generation circuit connected to each of a seventh terminal and an eighth terminal and generating a second reference voltage based on the voltage applied between the both ends of the plurality of battery cells; and a second comparator circuit comparing a second regulated voltage generated based on a voltage applied between the fifth terminal and the sixth terminal, with the second reference voltage, wherein all reference voltages generated by the plurality of reference voltage generation circuits for monitoring the plurality of battery cells are generated based on a voltage applied between both ends of at least two battery cells included in the plurality of cells, the all reference voltages including the first and second reference voltages.

16. A voltage sensor module monitoring a voltage of each of a plurality of battery cells, comprising:

a first terminal and a second terminal each to receive a voltage applied between both ends of the plurality of battery cells;

a third terminal and a fourth terminal each to receive a voltage applied between both ends of a single battery cell included in the plurality of battery cells;

a first reference voltage generation circuit connected to each of the first terminal and the second terminal and to generate a first reference voltage based on the voltage applied between the both ends of the plurality of battery cells;

a first comparator circuit to compare a first regulated voltage generated based on a voltage applied between the third terminal and the fourth terminal, with the first reference voltage;

a second reference voltage generation circuit connected to each of the third terminal and the fourth terminal and generating a second reference voltage based on the voltage applied between the third terminal and the fourth terminal; and a second comparator circuit comparing the first regulated voltage with the second reference voltage.

17. The voltage sensor module according to claim 16, wherein the first terminal and the third terminal are the same terminal.

18. The voltage sensor module according to claim 17, wherein the first regulated voltage is generated by a resistor ladder connected between the third terminal and the fourth terminal.

19. A voltage sensor module monitoring a voltage of each of a plurality of battery cells, the voltage sensor module comprising:

a plurality of reference voltage generation circuits, wherein the number of reference voltage generation circuits equals the number of battery cells; and a plurality of comparator circuits, wherein each of the plurality of reference voltage generation circuits is connected across at least two of the plurality of battery cells and outputs a reference voltage to one of the plurality of comparator circuits which compares a regulated voltage generated based on a voltage across one of the plurality of battery cells with the reference voltage.

* * * * *